US011537866B2

(12) United States Patent
Jaiswal et al.

(10) Patent No.: US 11,537,866 B2
(45) Date of Patent: Dec. 27, 2022

(54) OPTICAL NEURO-MIMETIC DEVICES

(71) Applicant: GLOBALFOUNDRIES U.S. INC., Santa Clara, CA (US)

(72) Inventors: Akhilesh R. Jaiswal, West Lafayette, IN (US); Ajey Poovannumoottil Jacob, Watervliet, NY (US); Yusheng Bian, Ballston Lake, NY (US); Michal Rakowski, Ballston Spa, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 245 days.

(21) Appl. No.: 16/880,253

(22) Filed: May 21, 2020

(65) Prior Publication Data

US 2021/0365768 A1 Nov. 25, 2021

(51) Int. Cl.
| | |
|---|---|
| *G06N 3/067* | (2006.01) |
| *H01L 27/144* | (2006.01) |
| *G06N 3/04* | (2006.01) |
| *H01L 31/0232* | (2014.01) |
| *H01L 31/02* | (2006.01) |

(52) U.S. Cl.
CPC ........... *G06N 3/067* (2013.01); *G06N 3/0481* (2013.01); *H01L 27/1443* (2013.01); *H01L 27/1446* (2013.01); *H01L 31/02019* (2013.01); *H01L 31/02325* (2013.01)

(58) Field of Classification Search
CPC .... G06N 3/067; G06N 3/0481; G06N 3/0675; H01L 27/1443; H01L 27/1446; H01L 31/02019; H01L 31/02325
See application file for complete search history.

(56) References Cited

U.S. PATENT DOCUMENTS

| | | | | |
|---|---|---|---|---|
| 2017/0351293 | A1* | 12/2017 | Carolan | G06E 3/006 |
| 2019/0311256 | A1* | 10/2019 | Hack | H01L 31/12 |
| 2020/0052183 | A1 | 2/2020 | Shainline et al. | |
| 2020/0110992 | A1* | 4/2020 | Hosseinzadeh | G06N 3/0472 |
| 2021/0208337 | A1* | 7/2021 | Pezeshki | G02B 6/43 |
| 2022/0045757 | A1* | 2/2022 | Pieros | H04B 10/27 |

OTHER PUBLICATIONS

Tait et al., "A silicon photonic modulator neuron", Department of Electrical Engineering, Princeton University, Princeton, Jan. 1, 2019, 17 pages.
Kravtsov et al. "Ultrafast all-optical implementation of a leaky integrate-and-fire neuron", Optics Express, Jan. 2011, 15 pages.
Nahmias et al., "A leaky integrate-and-fire laser neuron for ultrafast cognitive computing", IEEE Journal of Selected Topics in Quantum Electronics, vol. 19, No. 5, Sep.-Oct. 2013, 12 pages.

(Continued)

*Primary Examiner* — Jarrett J Stark
(74) *Attorney, Agent, or Firm* — David Cain; Andrew M. Calderon; Calderon Safran & Cole, P.C.

(57) ABSTRACT

The present disclosure relates to semiconductor structures and, more particularly, to optical neuro-mimetic devices and methods of manufacture. The structure includes: a plurality of photodetectors and electrical circuitry that converts photocurrent generated from the photodetectors into electrical current and then sums up the electrical current to mimic neural functionality.

17 Claims, 7 Drawing Sheets

(56) References Cited

OTHER PUBLICATIONS

Chakraborty et al., "Toward fast neural computing using all-photonic phase change spiking neurons", Scientific Reports, Aug. 28, 2018, 9 pages.
Taiwanese Office Action in related TW Application No. 110114248 dated Dec. 9, 2021, 7 pages.
Taiwanese Notice of Allowance in related TW Application No. 110114248 dated Jun. 15, 2022, 4 pages.

* cited by examiner

OPTICAL NEURO-MIMETIC DEVICES

FIELD OF THE INVENTION

The present disclosure relates to semiconductor structures and, more particularly, to optical neuro-mimetic devices and methods of manufacture.

BACKGROUND

Neuro-mimetic intelligence, also referred to as neuromorphic computing, is a type of artificial intelligence in which computational systems apply underlying concepts of neural processes for building intelligent systems. Current artificial intelligence systems are slow because they rely heavily on electronic circuits which have a frequency of operation in the GHz range.

Conventional photonic devices are used for photonics functions and, in recent times, have started to be implemented in optical neuro-mimetic devices. Photonics systems can work much faster than electronic circuitry, e.g., photonics can go towards THz operation. However, photonic systems are not 'intelligent' and are mostly data receiving and transmitting units. Also, works on artificial intelligence (AI) computing using conventional photonics devices have a low dynamic range, e.g., it is not possible to increase the dynamic range and 'tune' as needed. Accordingly, these systems have limited control. Rectified Linear Unit (ReLU) functionality, a function critical for implementation of neural networks, is also difficult to attain in photonic devices.

SUMMARY

In an aspect of the disclosure, a plurality of photodetectors and electrical circuitry that converts photocurrent generated from the photodetectors into electrical current and then sums up the electrical current to mimic neural functionality.

In an aspect of the disclosure, a structure comprises: a waveguide structure; a plurality of photodetectors coupled to the waveguide structure, each of which are capable of generating a photocurrent from light received as input from the waveguide structure; and electrical circuitry coupled to each respective photodetector of the plurality of photodetectors, the electrical circuitry converting the photocurrent into electrical current and then summing up the electrical current to provide a Sigmoid or Rectified Linear Unit (ReLU) neural transfer function.

In an aspect of the disclosure, a method comprises: generating a photocurrent by a plurality of photodetectors; converting each photocurrent of the plurality of photodetectors into an electrical current; and summing up each electrical current converted from each photocurrent and outputting the sum of each electrical current as a Sigmoid or Rectified Linear Unit (ReLU) neural network function.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to optical neuro-mimetic devices and methods of manufacture. More specifically, the present disclosure relates to optical neuro-mimetic devices for on-photonics artificial intelligence applications and methods of manufacture. Advantageously, the present disclosure provides improved performance, accuracy and bandwidth, with the ability to have controlled, high dynamic range and ease of tunability. Moreover, the optical neuro-mimetic devices can be easily co-integrated with other electronics and photonics neural networks.

More specifically, this disclosure presents hybrid photonic-electronic neurons that can mimic the behavior of ReLU and sigmoid neurons (e.g., neural functionality) with high tunable dynamic range. For example, the hybrid photonic-electronic neurons provide a dynamic range that can be easily controlled by a number of photodetectors. This circumvents a major challenge faced by known devices which are known to saturate and have limited dynamic range for ReLU functionality. In embodiments, the photonic structures will form sigmoid or ReLU or sigmoid neural network with integrated waveguides, micro-ring modulators, and/or detectors. The photonic structures can also be provided within a monolithic integration of electronics and other photonics components.

The optical neuro-mimetic devices of the present disclosure can be manufactured in a number of ways using a number of different tools. In general, though, the methodologies and tools are used to form structures with dimensions in the micrometer and nanometer scale. The methodologies, i.e., technologies, employed to manufacture the optical neuro-mimetic devices of the present disclosure have been adopted from integrated circuit (IC) technology. For example, the structures are built on wafers and are realized in films of material patterned by photolithographic processes on the top of a wafer. In particular, the fabrication of the optical neuro-mimetic devices uses three basic building blocks: (i) deposition of thin films of material on a substrate, (ii) applying a patterned mask on top of the films by photolithographic imaging, and (iii) etching the films selectively to the mask.

Figure 1:
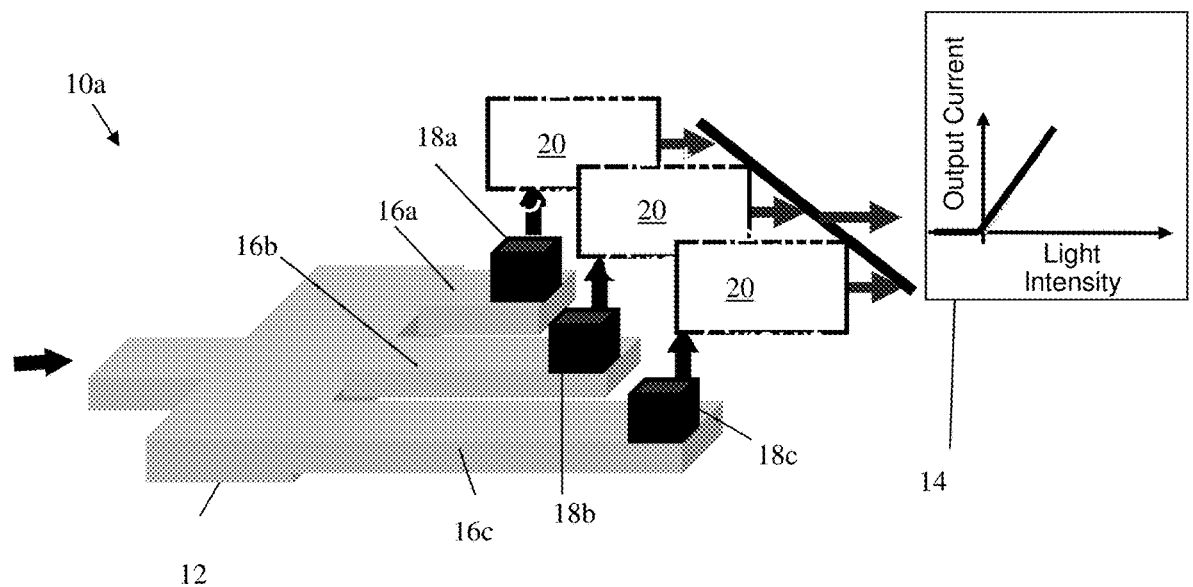
FIG. 1 shows an optical neuro-mimetic device in accordance with aspects of the present disclosure.

FIG. 1 shows an optical neuro-mimetic device in accordance with aspects of the present disclosure. More specifically, the optical neuro-mimetic device 10a shown in FIG. 1 includes a plurality of waveguide structures 16a, 16b and 16c of varying lengths coupled between a multi-mode interference (MMI) coupler 12 and respective photodetectors 18a, 18b, 18c, e.g., at an end at which light exits. In embodiments, the photodetectors 18a, 18b, 18c can be coupled to the waveguide structures 16a, 16b and 16c in any conventional manner as is known in the art such that no further explanation is required herein for a complete understanding of the disclosure. The photodetectors 18a, 18b, 18c generate a photocurrent, which is then input into the electrical circuits 20. And, as shown in FIG. 1, each of the outputs of the electrical circuits 20 will then be summed to provide a ReLu function as shown at reference numeral 14, e.g., output current will linearly increase with increased light intensity.

The waveguide structures 16a, 16b and 16c have the following lengths: 16a<16b<16c. Moreover, although three waveguide structures 16a, 16b and 16c are shown of different lengths, the present disclosure contemplates any number N+1 of waveguide structures of different lengths, each of which direct light from an outside source to its respective photodetector. And, by adjusting the number of waveguide structures of different lengths, it is now possible to easily tune or control the dynamic range of the optical neuro-mimetic device 10a as described herein. This circumvents a major challenge faced by known optical neuro-mimetic devices where devices saturate and have limited dynamic range for ReLU functionality.

Still referring to FIG. 1 and by way of more specific example, the first photodetector 18a coupled to the shortest waveguide structure 16a will receive light and generate a photocurrent. This photocurrent is then input into the electrical circuit 20, which will generate and output an electrical current. When the first photodetector 18a and associated electrical circuit 20 saturates (after reaching its light absorption/conversion limit), the second photodetector 18b coupled to the waveguide structures 16b will receive any remaining light and generate a photocurrent, which is then input into its respective electrical circuit 20. The electrical circuit 20 will generate and output an electrical current. This process will continue until all of the light is absorbed and converted into an electrical current by respective electrical circuits. Alternatively, any light that leaks past the waveguide structure 16a can be absorbed by the downstream photodetectors 18b, 18c, etc. In these scenarios, all of the light entering into the system will be converted into electrical signals by each of the respective electrical circuits 20, which is then summed to provide a high dynamic range for ReLU functionality, e.g., output current will linearly increase with increased light intensity as shown at reference numeral 14. Also, should the device need to be further tuned due to higher light intensity or lower light intensity, it is possible to add or subtract waveguide structures and respective photodetectors.

In embodiments, each of the waveguide structures 16a, 16b and 16c and the MMI coupler 12 can be fabricated from semiconductor material using conventional lithography, etching and deposition methods such that no further explanation is required herein for a complete understanding of the present disclosure. In preferred embodiments, the waveguide structures 16a, 16b and 16c and the MMI coupler 12 can be fabricated from Si material; although other semiconductor materials are also contemplated herein. For example, the semiconductor material may be composed of any suitable material including, but not limited to, Si, SiGeC, SiC, GaAs, InAs, InP, and other III/V or II/VI compound semiconductors. Moreover, the photodetectors 18 can be any conventional photodetector composed of material different than the waveguide structures 16a, 16b, 16c. For example, the photodetectors 18 can be SiGe material with or without a nitride liner and either embedded within the semiconductor material or over a surface of the semiconductor material of the waveguide structures 16a, 16b, 16c.

Figure 2:
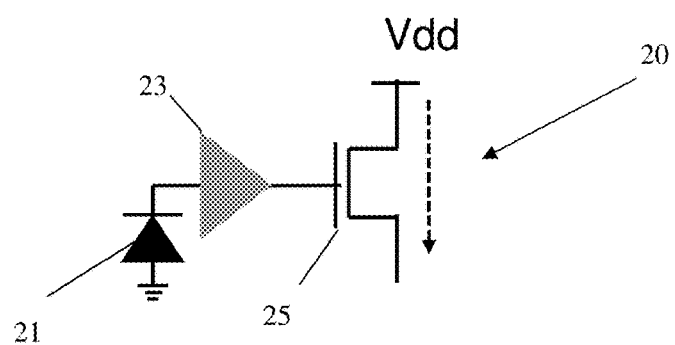
FIG. 2 shows an electrical circuit used with the photonic device (optical device) in accordance with aspects of the present disclosure.

FIG. 2 shows an electric circuit 20 used with the photonic device (optical device) of any of the embodiments described herein. As shown, the electric circuit 20 includes a diode 21 connected in series with an amplifier 23 and a transistor 25. In embodiments, the amplifier 23 is optional. The transistor 25 can be a PMOS or a NMOS, precharged by Vdd. In operation, each of the photodetectors will generate a photocurrent which is input to its respective circuit 20 and, with assistance from the precharge, the respective circuit 20 will discharge an electrical current. In embodiments, the amplifier 23 can amplify the photocurrent provided by the photodetector. The electrical current of each of the circuits 20 can then be summed to provide the ReLU functionality, e.g., output current will linearly increase with increased light intensity as shown at reference numeral 14 of FIG. 1.

Figure 3:
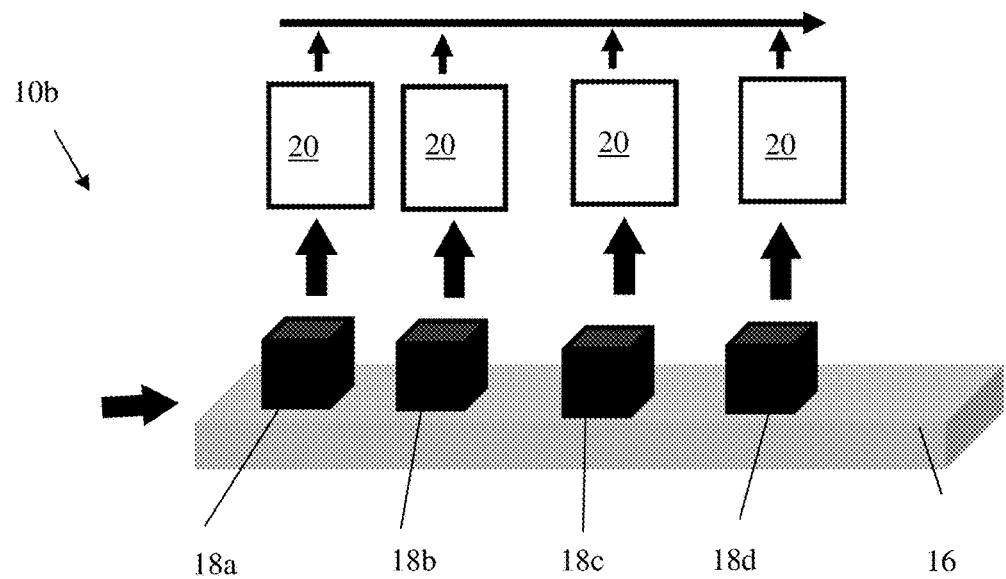
FIG. 3 shows a linear optical neuro-mimetic device in accordance with aspects of the present disclosure.

FIG. 3 shows a linear optical neuro-mimetic device 10b with a plurality of photodetectors 18a, 18b, 18c, 18d coupled to a single waveguide structure 16 along its length. In this embodiments, each of the photodetectors 18a, 18b, 18c, 18d can be of the same size, e.g., length; although as discussed with respect to FIGS. 4 and 5, different sized photodetectors are also contemplated herein. Also, as in each of the embodiments, the photodetectors 18a, 18b, 18c, 18d are coupled to a respective electrical circuit 20. It should also be understood by those of skill in the art that, as in each of the embodiments, any number N+1 of photodetectors are contemplated for use herein depending on the desired frequency range.

In the configuration of FIG. 3, the photodetector 18a coupled to the waveguide structure 16 will receive light and generate a photocurrent for input into its respective circuit 20. The electrical circuit 20 will then generate an electrical current from the photocurrent. Any light that leaks past the photodetector 18a or when the photodetector 18a becomes saturated, will then pass into the next photodetector 18b. The photodetector 18b will then generate a photocurrent, which is input into its respective electrical circuit 20 for converting the photocurrent into an electrical current. This same process will continue until all of the remaining light is absorbed, e.g., absorbed by photodetector 18d (if enough light is available). In this way, all of the light entering the waveguide structure 16 will contribute to an electrical signal that will be summed to provide a dynamic range for ReLU functionality.

Figure 4:
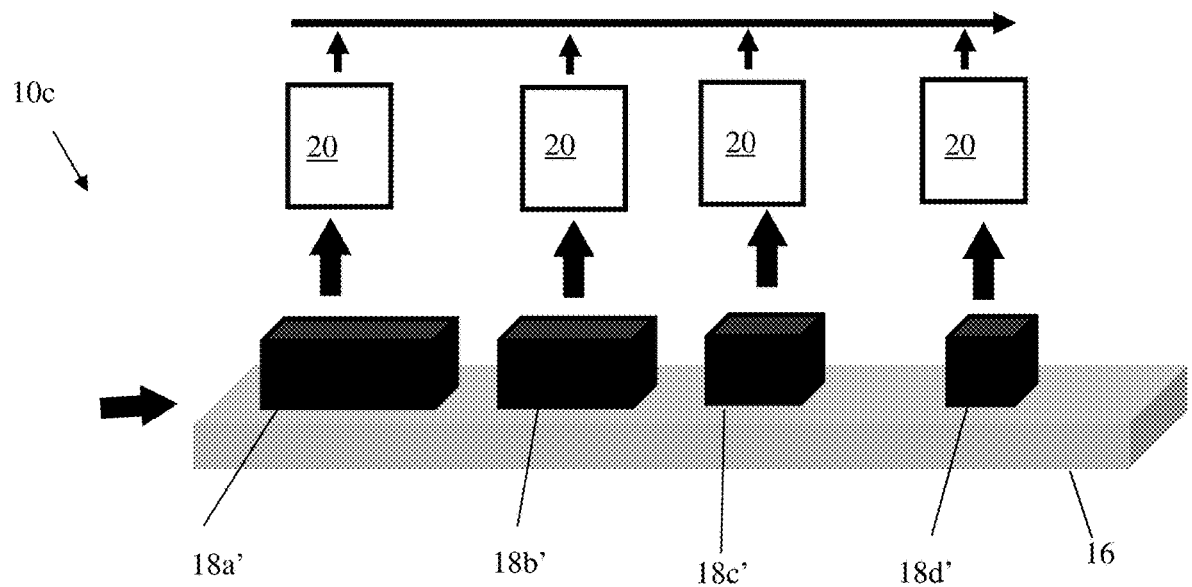
FIG. 4 shows a linear optical neuro-mimetic device with photonic devices of different dimensions in accordance with aspects of the present disclosure.

FIG. 4 shows a linear optical neuro-mimetic device 10c with a plurality of photodetectors 18a', 18b', 18c', 18d' of different lengths, each of which are coupled to a linear waveguide structure 16 along its length. Also, each of the photodetectors 18a', 18b', 18c', 18d' are coupled to a respective electrical circuit 20. In this configuration, the length of the photodetectors are as follows: 18a'>18b'>18c'>18d'. As should be understood by those of skill in the art, longer photodetectors will absorb more light than shorter photodetectors such that, depending on the light intensity, most of the light can be absorbed by the photodetector 18a'.

In the configuration of FIG. 4, the photodetector 18a will receive light and generate a photocurrent for input into its respective circuit 20. The electrical circuit 20 will then generate an electrical current from the photocurrent. Any light that leaks past the photodetector 18a' or when the photodetector 18a becomes saturated, will pass into the next photodetector 18b'. The photodetector 18b' will then generate a photocurrent, which is input into its respective electrical circuit 20 for converting the photocurrent into an electrical current. This same process will continue until all of the remaining light is absorbed, e.g., absorbed by photodetector 18d' (if enough light is available). In this way, all of the light entering the waveguide structure 16 will contribute to an electrical signal that will be summed to provide a dynamic range for ReLU functionality.

Figure 5:
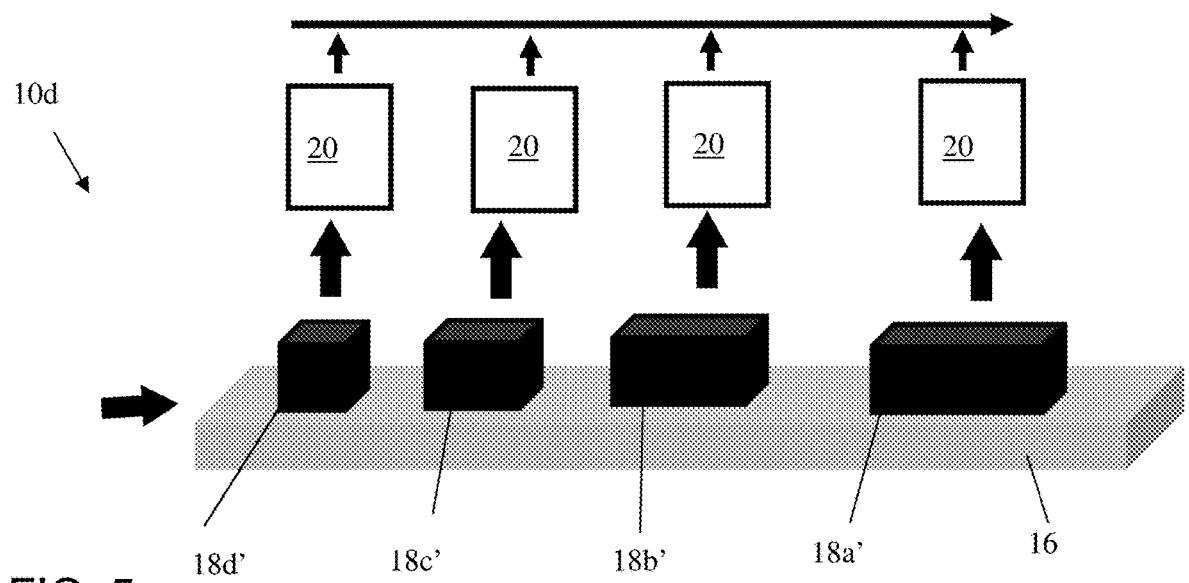
FIG. 5 shows a linear optical neuro-mimetic device with photonic devices of different dimensions in accordance with additional aspects of the present disclosure.

FIG. 5 also shows a linear optical neuro-mimetic device 10d comprising a plurality of photodetectors 18a', 18b', 18c', 18d' of different lengths, e.g., 18a'>18b'>18c'>18d', coupled to the single waveguide structure 16 along its length. As in the embodiment shown in FIG. 4, each of the photodetectors 18a', 18b', 18c', 18d' are coupled to a respective electrical circuit 20; however, in this configuration, the smallest (e.g., shortest) photodetector 18d' is now closest to the light input with successive photodetectors 18c', 18b', 18a', in sequential order, coupled to the waveguide structure 16. The operation of the linear optical neuro-mimetic device 10d is similar to that described with FIG. 4, with the understanding that the photodetector 18d' will partially absorb the incoming light, likely resulting in one or more of the downstream photodetectors 18a, 18b', 18c' receiving the additional light to generate a photocurrent and contribute to the electrical signal that will then be summed to provide a dynamic range for ReLU functionality.

Figure 6:
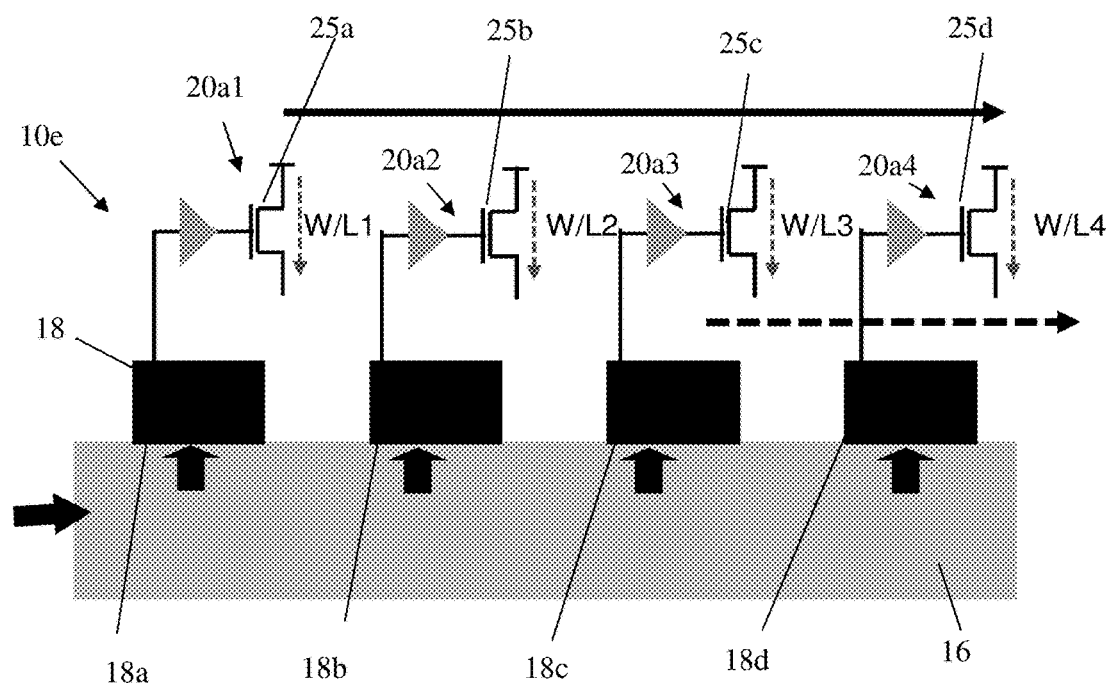
FIG. 6 shows an optical neuro-mimetic device with alternative electrical circuitry in accordance with aspects of the present disclosure.

FIG. 6 shows an optical neuro-mimetic device 10e with alternative electrical circuitry 20a1, 20a2, 20a3, 20a4 which includes a respective transistor 25a, 25b, 25c, 25d. In this embodiment, the respective transistors 25a, 25b, 25c, 25d each have a different area (W/L). More specifically, in this embodiment, each successive transistor 25a, 25b, 25c, 25d, farther away from the light source, will have a larger area, L4>L3>L2>L1. In this way, each electrical circuitry 20a1, 20a2, 20a3, 20a4 can generate a larger electrical current with a decrease of light absorption from its respective photodetector 18a, 18b, 18c, 18d. Although not shown, it should also be recognized that the electrical circuitry can include the diode.

Figure 7:
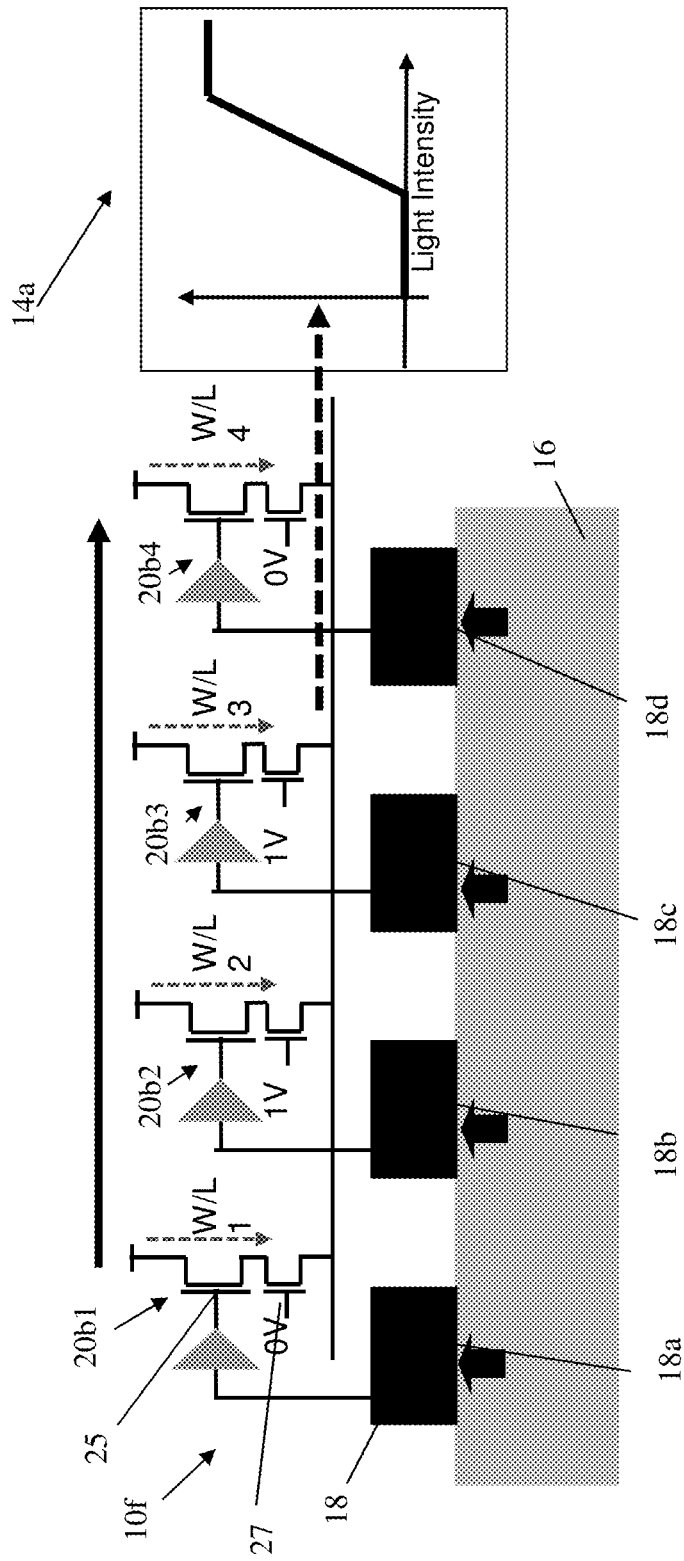
FIG. 7 shows an optical neuro-mimetic device with alternative electrical circuitry in accordance with additional aspects of the present disclosure.

FIG. 7 shows an optical neuro-mimetic device 10f with alternative electrical circuitry 20b1, 20b2, 20b3, 20b4. In addition to having different areas as noted with respect to FIG. 6, each circuitry 20b1, 20b2, 20b3, 20b4 also includes two transistors 25, 27 provided in series. In this configuration, the transistor 27 can be turned on and off by an application of an input voltage, e.g., 1V or 0V, to tune the device. For example, turning on the transistor 27 with an input voltage 1V will enable the photocurrent from respective photodetectors 18b, 18c to be utilized in the summation process; whereas, an input voltage 0V will block the photocurrent from respective photodetectors 18a, 18d from being utilized in the summation process. In this way, the optical neuro-mimetic device 10f provides further tunability with increased dynamic range. Note, as a specific example, the first branch 20b1 and last branch 20b4 can be disabled thereby mimicking another important neural transfer, i.e., the sigmoid function shown in 14a. It should be understood that any of the photodetectors 18a, 18b, 18c, 18d can be turned on and off and that the signals provided in FIG. 7 are for illustrative non-limiting purposes.

Figure 8:
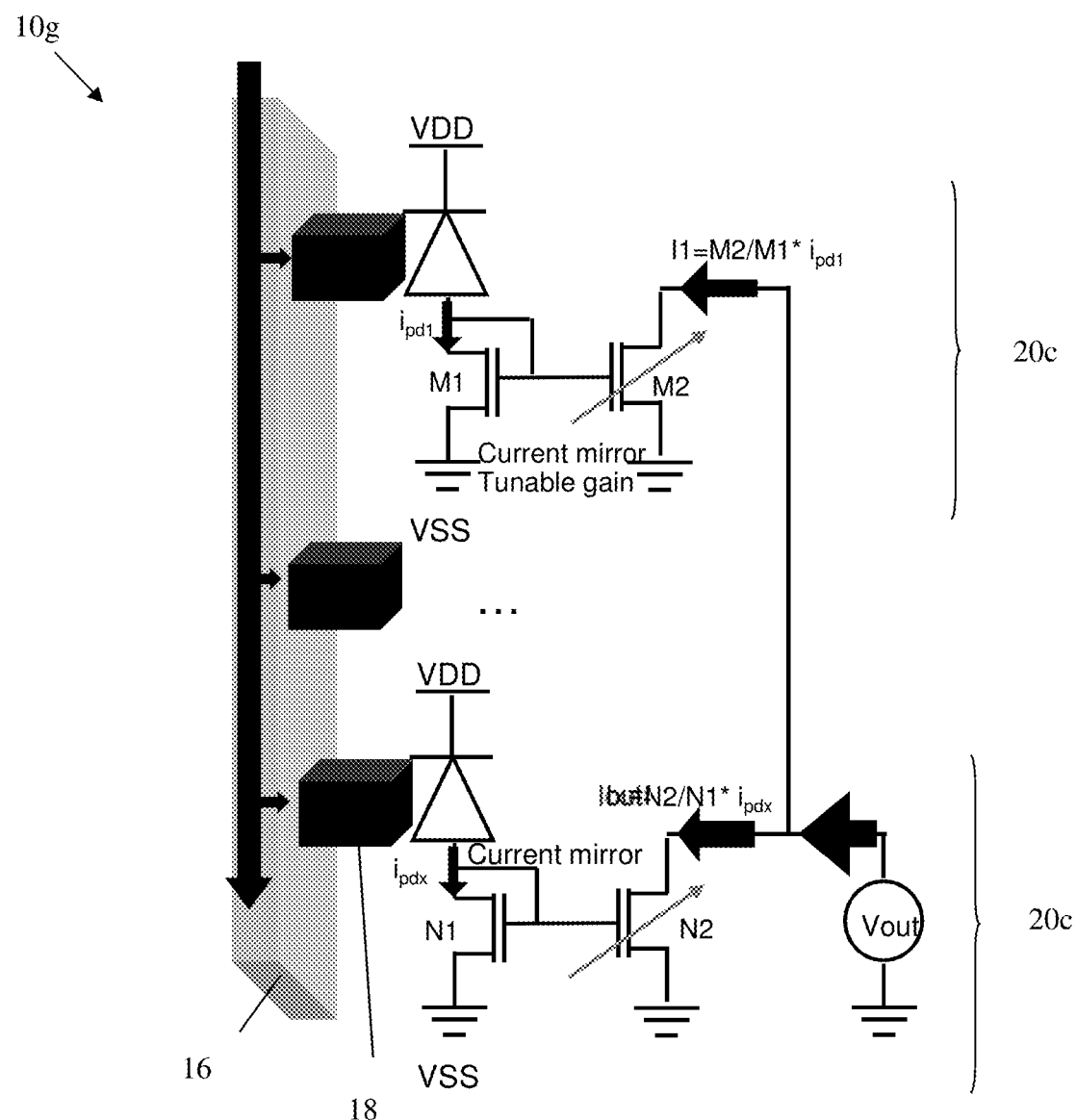
FIG. 8 shows an optical neuro-mimetic device with tunable current mirrors in accordance with aspects of the present disclosure.

FIG. 8 shows an optical neuro-mimetic device 10g with tunable current mirror circuitry 20c. In this implementation, light passing through the waveguide 16 is partially absorbed by photodetectors 18, generating a photocurrent (ipd1 . . . x). The photocurrent can be amplified by the tunable current mirrors 20c resulting in almost any current value (i1, . . . x). All of the current values can be summed up as previously noted, with the electrical output being tuned by regulating the current mirrors 20c.

Figure 9:
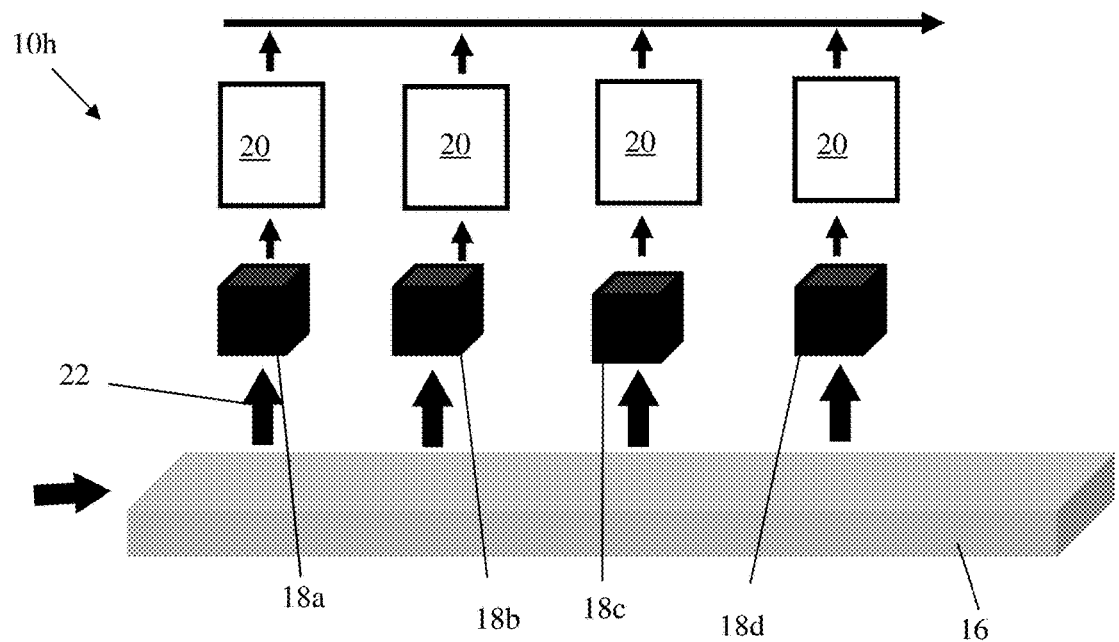
FIG. 9 shows an optical neuro-mimetic device with directional couplers in accordance with aspects of the present disclosure.

FIG. 9 shows an optical neuro-mimetic device 10h with couplers 22. In this implementation, light passing through the waveguide structure 16 is partially coupled to the corresponding photodetectors 18 with the assistance of directional couplers or adiabatic couplers 22. In embodiments, the interaction between the waveguide structure 16 and the couplers 22 are based on evanescent coupling, although the interaction between the couplers 22 and photodetectors 18 can leverage either evanescent coupling or butt-end coupling.

Figure 10:
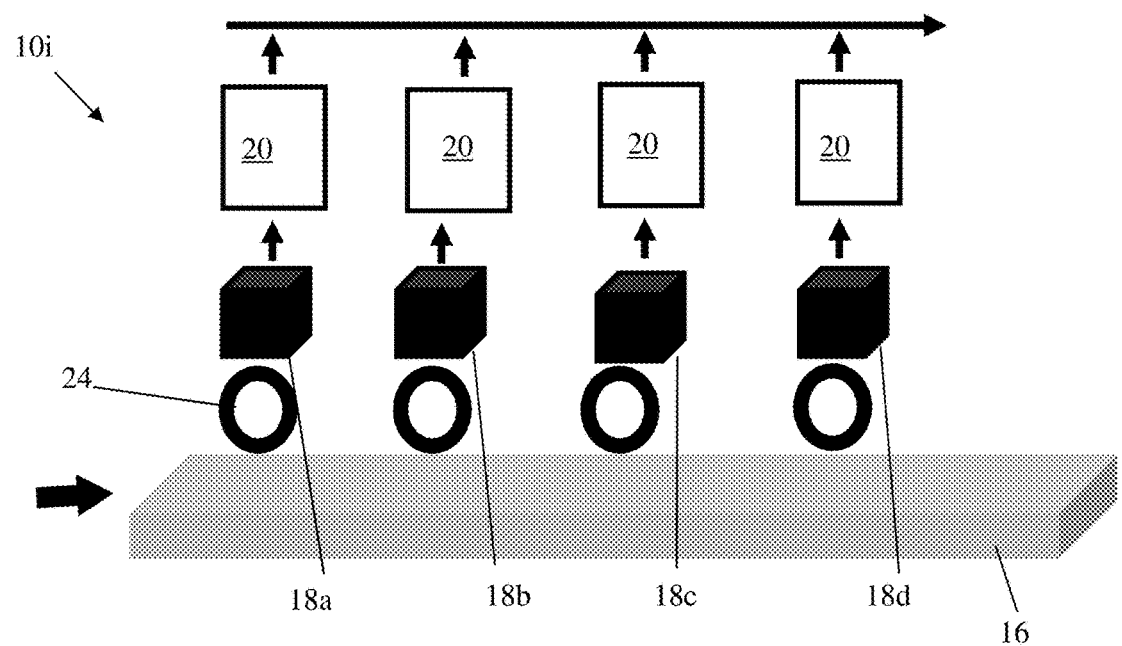
FIG. 10 shows an optical neuro-mimetic device with ring resonators in accordance with aspects of the present disclosure.

FIG. 10 shows an optical neuro-mimetic device 10i with ring resonators 24. In this implementation, the ring resonators 24 are micro-optical ring resonators, which are coupled between the waveguide structure 16 and respective photodetectors 18a, 18b, 18c, 18d. As should be understood by those of skill in the art, the ring resonator 24 is a set of waveguides in which at least one is a closed loop coupled to the light input, e.g., waveguide structure 16, and output, e.g., photodetectors. When light of the resonant wavelength is passed through the loop from input waveguide structure 16, it builds up in intensity over multiple round-trips due to constructive interference and is output to the photodetector. Because only a select few wavelengths will be at resonance within the loop, the optical ring resonator functions as a filter. Additionally, two or more ring waveguides can be coupled to each other to form an add/drop optical filter.

Figure 11A:
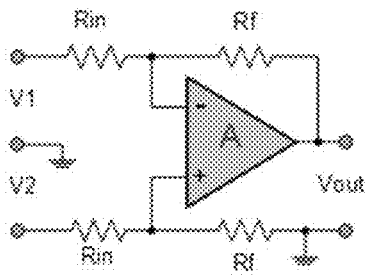
FIGS. 11A-11D show alternative circuitry that can be implemented with the optical neuro-mimetic devices in accordance with the different aspects of the present disclosure.
Figure 11B:
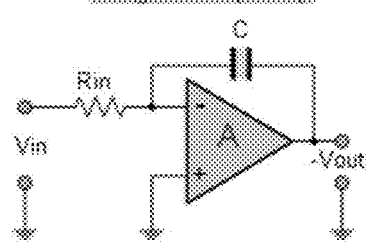
Figure 11C:
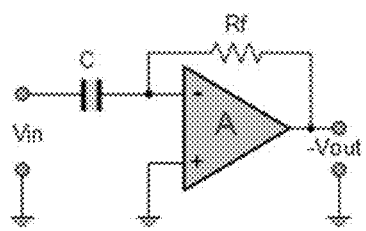
Figure 11D:
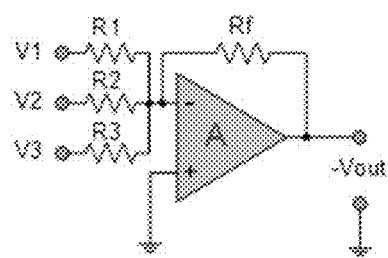

FIGS. 11A-11D show alternative circuitry that can be implemented with the optical neuro-mimetic devices in accordance with the different aspects of the present disclosure. More specifically, FIG. 11A shows a differential op-amp, FIG. 11B shows an integrator op-amp, FIG. 11C shows a differentiator op-amp and FIG. 11D shows a summing op-amp. By using these different operation amplifiers additional operations are possible such as while dealing with voltages (e.g., summing, subtracting, integrating and differentiating).

The optical neuro-mimetic devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) and/or structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a plurality of photodetectors and electrical circuitry that converts photocurrent generated from the photodetectors into electrical current and then sums up the electrical current to mimic neural functionality; and a waveguide structure,
wherein the plurality of photodetectors are arranged along a length of the waveguide structure and the each of the plurality of photodetectors are of a different length.

2. The structure of claim 1, wherein the mimicking of neural transfer functionality is a Sigmoid or Rectified Linear Unit (ReLU) output.

3. The structure of claim 1, further comprising a waveguide structure that includes a plurality of branches of different lengths and each of the branches, at is end, includes a respective photodetector.

4. The structure of claim 1, wherein the length of each of the plurality of photodetectors increases or decreases along the length of the waveguide structure as they move farther away from an input of the waveguide structure.

5. The structure of claim 1, wherein the plurality of photodetectors are coupled to the waveguide structure by directional couplers or adiabatic couplers or ring resonators.

6. The structure of claim 1, wherein the plurality of photodetectors are coupled to the waveguide structure by evanescent coupling or butt-end coupling.

7. The structure of claim 1, wherein the electrical circuitry is a plurality of circuits each of which are associated with a respective one of the plurality of photodetectors, and each successively positioned electrical circuit has a larger transistor than a previously placed electrical circuit.

8. The structure of claim 7, wherein the electrical circuitry includes a second transistor that is configured to allow or prevent the photocurrent from being used to generate an electrical current for output by the electrical circuitry.

9. The structure of claim 1, wherein the electrical circuitry are tunable current mirrors.

10. A structure comprising:
a waveguide structure;
a plurality of photodetectors coupled to the waveguide structure, each of which are capable of generating a photocurrent from light received as input from the waveguide structure; and
electrical circuitry coupled to each respective photodetector of the plurality of photodetectors, the electrical circuitry converting the photocurrent into electrical current and then summing up the electrical current to provide a Sigmoid or Rectified Linear Unit (ReLU) neural transfer function,
wherein the photodetectors are arranged along a length of the waveguide structure and each of the plurality of photodetectors are of a different length.

11. The structure of claim 10, wherein the waveguide structure includes a plurality of branches of different lengths and each of the branches includes a photodetector.

12. The structure of claim 10, wherein the different length either increases or decreases along the length of the waveguide structure as they move farther away from an input of the waveguide structure.

13. The structure of claim 10, wherein the plurality of photodetectors are coupled to the waveguide structure by directional couplers or adiabatic couplers or ring resonators.

14. The structure of claim 10, wherein the electrical circuitry is a plurality of circuits each of which are associated with a respective one of the plurality of photodetectors, and each successively positioned electrical circuit has a larger transistor than a previously placed electrical circuit.

15. The structure of claim 14, wherein the electrical circuitry includes a second transistor that is configured to allow or prevent the photocurrent from being used to generate an electrical current for output by the electrical circuitry.

16. The structure of claim 10, wherein the electrical circuitry are tunable current mirrors.

17. A method comprising;
generating a photocurrent by a plurality of photodetectors;
converting each photocurrent of the plurality of photodetectors into an electrical current; and
summing up each electrical current converted from each photocurrent and outputting the sum of each electrical current as a Sigmoid or Rectified Linear Unit (ReLU) neural network function,
wherein the photodetectors are arranged along a length of the waveguide structure and each of the plurality of photodetectors are of a different length.

* * * * *